(12) United States Patent
Chuang et al.

(10) Patent No.: US 8,320,164 B2
(45) Date of Patent: Nov. 27, 2012

(54) STATIC RANDOM ACCESS MEMORY WITH DATA CONTROLLED POWER SUPPLY

(75) Inventors: Ching-Te Chuang, Taipei County (TW); Hao-I Yang, Taipei (TW); Mao-Chih Hsia, Kaohsiung (TW); Yung-Wei Lin, Taichung County (TW); Chien-Yu Lu, Taichung (TW); Ming-Hsien Tu, Tainan (TW); Wei Hwang, Taipei (TW); Shyh-Jye Jou, Hsinchu County (TW); Chia-Cheng Chen, Taichung (TW); Wei-Chiang Shih, Taipei (TW)

(73) Assignees: Faraday Technology Corp., Science-Based Industrial Park, Hsin-Chu (TW); National Chiao Tung University, Hsinchu (TW)

( * ) Notice: Subject to any disclaimer, the term of this patent is extended or adjusted under 35 U.S.C. 154(b) by 93 days.

(21) Appl. No.: 12/985,289

(22) Filed: Jan. 5, 2011

(65) Prior Publication Data

US 2012/0008377 A1    Jan. 12, 2012

Related U.S. Application Data

(60) Provisional application No. 61/361,527, filed on Jul. 6, 2010.

(51) Int. Cl.
*G11C 11/00* (2006.01)

(52) U.S. Cl. ............... 365/154; 365/226; 365/189.16

(58) Field of Classification Search .......... 365/154, 365/226, 189.16, 189.15, 189.11, 203, 230.05, 365/230.03, 189.06, 189.09, 189.07
See application file for complete search history.

(56) References Cited

U.S. PATENT DOCUMENTS

| | | | |
|---|---|---|---|
| 7,502,275 B2 * | 3/2009 | Nii et al. | 365/226 |
| 7,688,668 B2 * | 3/2010 | Hold | 365/226 |
| 2007/0236983 A1 * | 10/2007 | Wang et al. | 365/154 |

* cited by examiner

*Primary Examiner* — Dang Nguyen
(74) *Attorney, Agent, or Firm* — Winston Hsu; Scott Margo

(57) ABSTRACT

A static random access memory with data controlled power supply, which comprises a memory cell circuit and at least one Write-assist circuit, for providing power to the memory cell circuit according to data to be written to the memory cell circuit.

19 Claims, 11 Drawing Sheets

STATIC RANDOM ACCESS MEMORY WITH DATA CONTROLLED POWER SUPPLY

CROSS REFERENCE TO RELATED APPLICATIONS

This application claims the provisional application, which is U.S. Provisional Application No. 61/361,527, filed Jun. 7, 2010 and is included herein by reference.

BACKGROUND OF THE INVENTION

1. Field of the Invention

The present application relates to a Static Random Access Memory (SRAM), and particularly relates to a SRAM with data controlled power supply.

2. Description of the Prior Art

Please refer to FIG. 1. FIG. 1 is a diagram illustrating a conventional SRAM. The SRAM comprises a SRAM cell 10 and a sense amplifier (not shown). The conventional SRAM cell 10 comprises six switch devices, i.e., a so-called 6T SRAM cell. The switch devices Me and Mf are the access switch devices, and also called pass switch devices. The latch circuit 11 comprises two inverters 11a and 11b, and each one of the inverters 11a and 11b comprises two switch devices. When a logic value (i.e., the bit value stored) in the SRAM cell 10 is read, the voltage level of the first bit-line 12 and the second bit-line 16 are charged to a high voltage level. Then, the voltage level of the word-line 14 is raised to a high voltage level to turn on the access switch devices Me and Mf. Depending on the data stored in the SRAM cell, one of the storage nodes (either Na or Nb) will be at logic "Low" voltage level, and the corresponding bit-line (either the first bit-line 12, or the second bit-line 16) will be pulled down.

The sense amplifier of the SRAM then determines the logic value stored in the latch circuit 11 according to the voltage levels of the first bit-line 12 and the second bit-line 16. In addition, when a logic value (i.e., the bit value being written) is written to the SRAM cell 10, the voltage level of the word-line 14 is charged to a high voltage level to turn on the access switch devices Me and Mf. Then, if the bit value being written is logic 1, the voltage level of the first bit-line 12 is charged to the high voltage level and the voltage level of the second bit-line 16 is discharged to the low voltage level; or if the bit value being written is logic 0, the voltage level of the first bit-line 12 is discharged to the low voltage level and the voltage level of the second bit-line 16 is charged to the high voltage level.

Accordingly, the logic value (i.e., the bit value being written) is written into the latch circuit 11 by complementing the voltage levels of the first bit-line 12 and the second bit-line 16.

When the bit value of logic 0 is read from the latch circuit 11, the latch circuit 11 discharges the voltage level of the bit-line coupled to the logic 0 storage node of the latch circuit 11. However, the electric charge on the bit-line is also poured to the cell storage node (Na or Nb) coupled to the bit-line when the bit value of logic 0 is read from the latch circuit 11. Furthermore, since the access switch device (Me or Mf), or called pass switch device, forms a voltage divider with the pull-down switch device of the inverter in the latch circuit 11, the cell storage node (Na or Nb) of the latch circuit may suffer from a disturb voltage, which is called the Read-Select-Disturb phenomenon. If the disturb voltage level is large enough to flip the opposite side inverter of the latch circuit 11, the logic value stored in the latch circuit 11 could be flipped, and the sense amplifier may read a wrong value from the latch circuit 11.

Furthermore, in the process of reading or writing the bit value into the latch circuit 11, when the voltage level of the word-line 14 is charged to the high voltage level, all of the access switch devices Me or Mf in the SRAM cells coupled to the word-line 14 are turned on, then the SRAM cells that are coupled to the word-line 14 but not coupled to the bit-lines 12 and 16 may also suffer from a disturb phenomenon similar to the Read-Select-Disturb phenomenon. Thus, the logic values stored in the aforementioned SRAM cells could be changed, which is called the Half-Select-Disturb phenomenon. The Half-Select-Disturb phenomenon is called Read-Half-Select-Disturb when the Half-Select-Disturb phenomenon occurs in the process of reading. Otherwise, the Half-Select-Disturb phenomenon is called Write-Half-Select-Disturb as the Half-Select-Disturb phenomenon occurs in the process of writing.

Since the access switch devices (e.g., the switch devices Me and Mf in FIG. 1) have both the role of passing the write-in data into the latch circuit 11 and passing the read-out data to the bit-lines, the read stability of the data and the data write-in speed of the SRAM is a trade-off. To reduce Read-Select-Disturb and Half-Select-Disturb, the access switch devices need to be sized down. On the other hand, to improve Write Margin (WM) and write-in speed, the access switch devices need to be sized up. In addition, the supply voltage level of the SRAM is getting lower in advanced manufacturing processes, and therefore the threshold voltage ($V_T$) of the switch device in the SRAM is lower also, while the spread of $V_T$ (called $V_T$ scatter) becomes larger. Accordingly, the stability of the data stored in the latch circuit 11 is more easily affected by the spread or variation of the threshold voltage ($V_T$) of the switch device in the SRAM. Therefore, providing a stable and high speed SRAM cell is a significant concern in this field.

SUMMARY OF THE INVENTION

One objective of the present application is to provide a SRAM with data controlled power supply.

One embodiment of the present application discloses a SRAM with data controlled power supply, which comprises a memory cell circuit and at least one Write-assist circuit, for providing power to the memory cell circuit according to data to be written to the memory cell circuit. The Write-assist circuit can include a plurality of switch devices. For example, the Write-assist circuit can include a first switch device, having a first terminal coupled to a first column-based Write word-line, a second terminal coupled to a first predetermined voltage level and a third terminal to provide the power to the memory cell circuit; and a second switch device, having a first terminal coupled to a second column-based Write word-line, a second terminal coupled to the first predetermined voltage level and a third terminal to provide the power to the memory cell circuit.

The memory cell circuit can include a 6T structure (6 switch devices), a 7T structure, a 8T structure or a 9T structure. Preferably, a cross-point double-layer pass-gate structure is applied to the memory cell circuit.

In view of above-mentioned embodiments, the Write-assist circuit is data-aware and can dynamically adjust power supply for left-half and right-half cell according to the input data. Dynamically lowering half-cell power supply based on input data reduces the contention of holding PMOS to facilitate discharging of the cell storage node, while the opposite half-cell inverter remains unaffected to maintain its latching strength and feedback mechanism, thus improving Write-ability, Write Margin, and Write performance. Data-aware switching of half-cell supplies also reduces dynamic supply switching power and noise to half, and improves supply switching speed. Hence, fast, low-power, low noise dynamic supply switching can be performed, and the Write-ability and the Time-to-Write can be improved. Besides, the timing of power supply switching (i.e. turning on/off of the Write-assist circuit) is initiated directly from the input data, thus tolerant to PVT variation and $V_T$ scatter. The embodiments require only 2 power-switch PMOSFETs and 2 power keepers per column (bit-line pair) and do not introduce any extra loading to bit-line, hence high-performance, low-voltage, low-power operation with minimum overhead of device count and area can be achieved.

These and other objectives of the present application will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
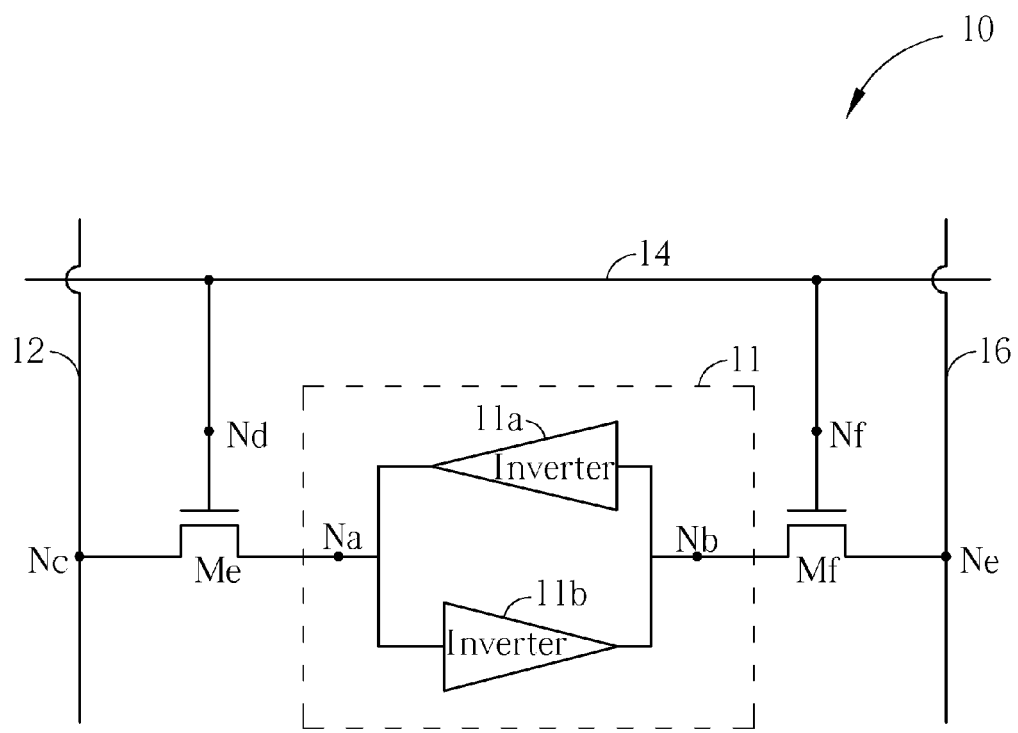
FIG. 1 is a diagram illustrating a conventional 6T SRAM.
Figure 2:
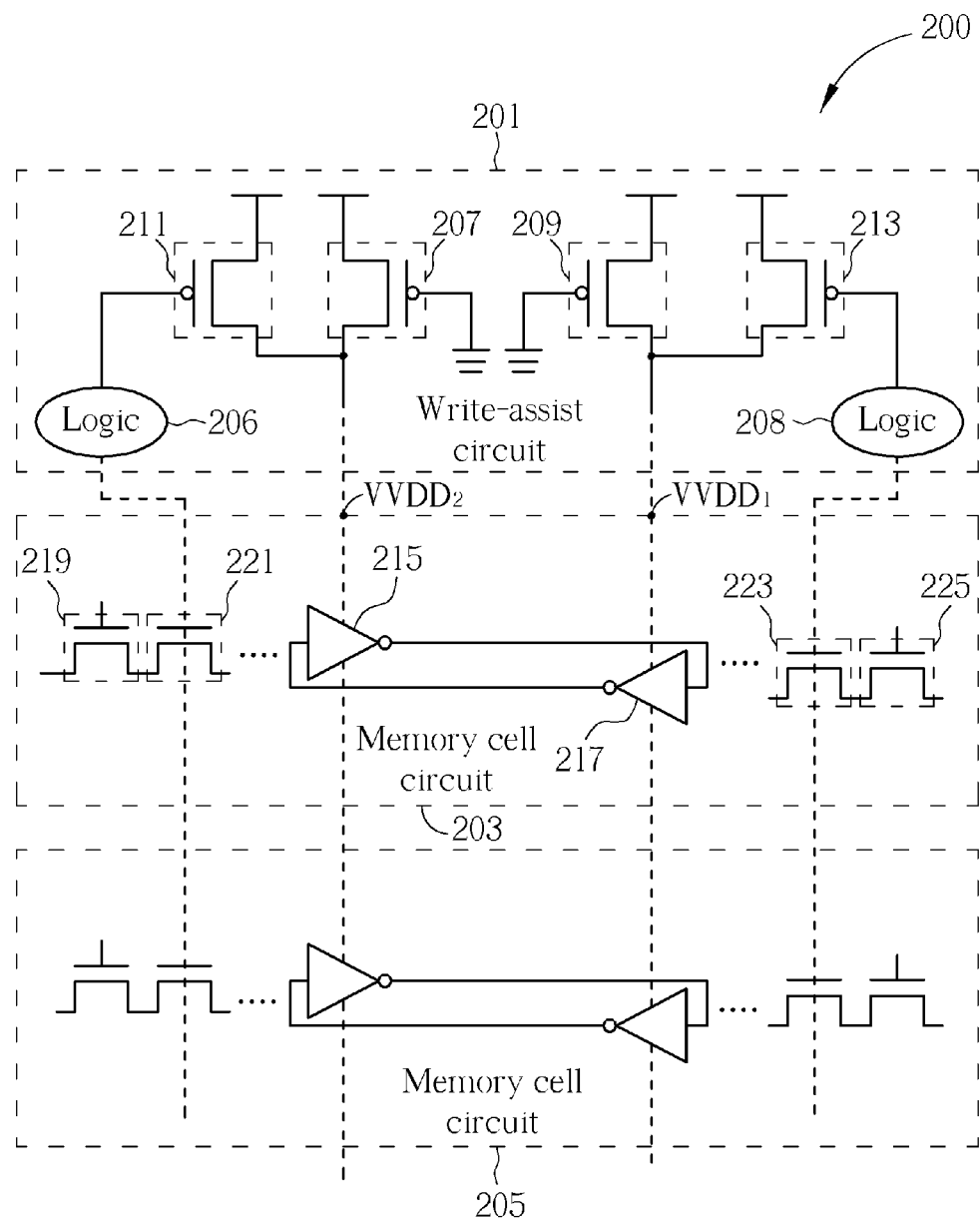
FIG. 2 is a block diagram illustrating a SRAM with data-controlled power supply according to embodiments of the present application.

FIG. 2 is a block diagram illustrating a SRAM with data-controlled power supply according to embodiments of the present application. As shown in FIG. 2, the SRAM with data-controlled power supply 200 includes a Write-assist circuit 201 and at least one memory cell circuit 203. In this exemplary embodiment, two memory cell circuits 203 and 205 are shown. The Write-assist circuit 201 provides powers VVDD1 and VVDD2 to the memory cell circuit 203 and 205 according to data to be written to the memory cell circuits 203 or 205 (i.e. DATA and DATA'). Please note that in one embodiment the SRAM only needs one Write-assist circuit 201 for each column, not for each cell.

In some preferred embodiments, the memory cell circuit utilized in the present application includes a cross-point double-layer pass-gate structure. That is, the memory cell circuit includes a plurality of data accessing terminals and the data accessing terminals are respectively controlled by at least two power switch devices. The cross-point double-layer pass-gate structure can be a 6T structure, 7T structure, 8T structure, or a 9T structure.

The Write-assist circuit 201 includes a plurality of switch devices 207, 209, 211 and 213 in this exemplary embodiment.

Also, the Write-assist circuit 201 can further include a plurality of logic circuits 206 and 208, according to different circuit design. The memory cell circuit 203 can include a plurality of inverters 215 and 217 to constitute a latch circuit, and a plurality of switch devices 219, 221, 223, and 225. It should be noted that the elements included in the Write-assist circuit 201 and memory cell circuits 203 and 205 are only for example, but do not mean to limit the scope of the present application. The detail structure examples of the Write-assist circuit and the memory cell circuits will be described as follows.

Figure 3:
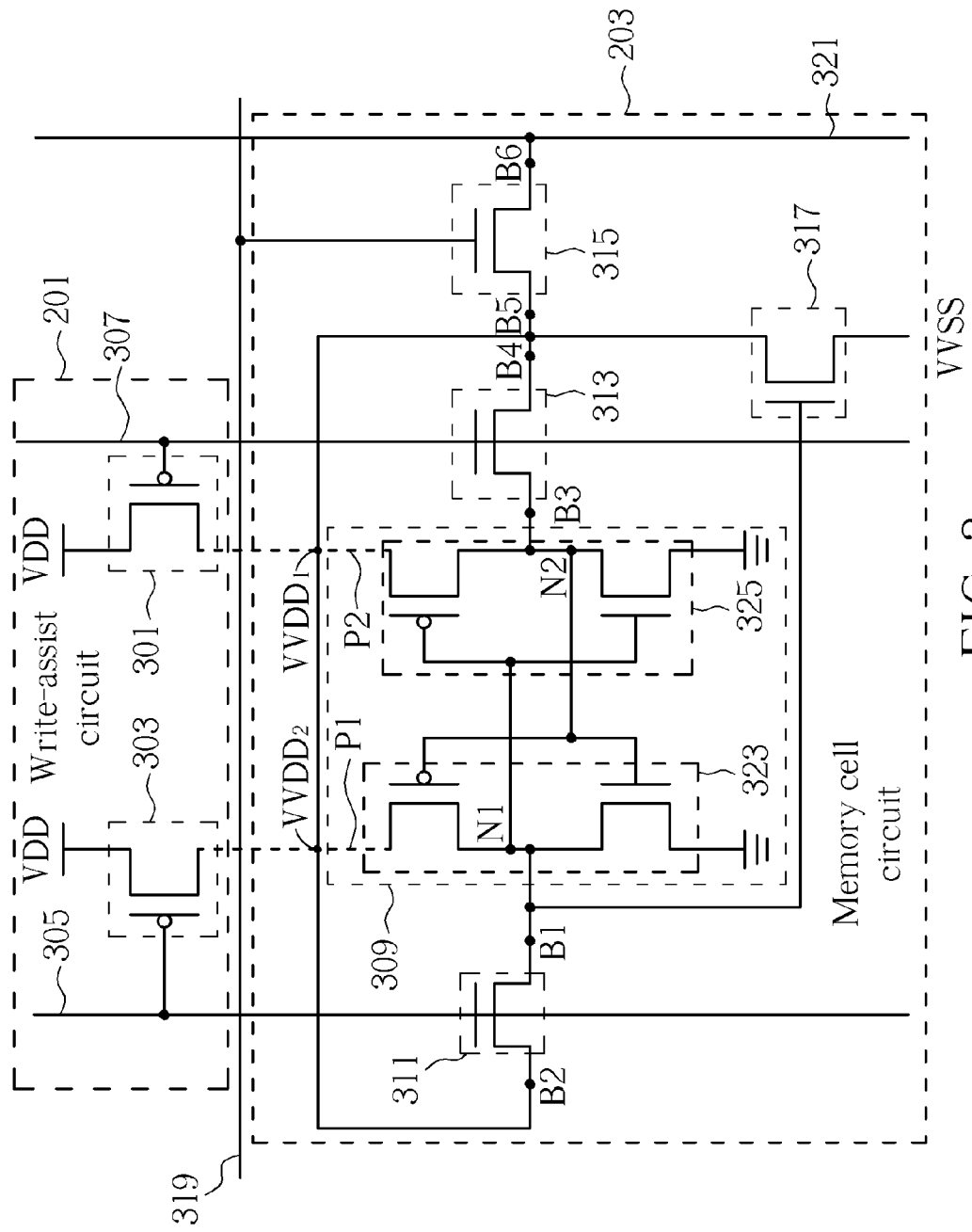
FIGS. 3-8 are circuit diagrams illustrating the detail structures of the embodiments shown in FIG. 2.

FIGS. 3-11 are circuit diagrams illustrating the detail structure examples of the SRAM shown in FIG. 2. As shown in FIG. 3, the Write-assist circuit 201 includes switch devices 301 and 303 (PMOSFETs in this embodiment). The switch device 301 includes a control terminal coupled to a Write world-line 307, a terminal coupled to a first predetermined voltage level VDD and another terminal to provide the power VVDD1 to the memory cell circuit 203. The switch device 303 has a control terminal coupled to a Write world-line 305, a terminal coupled to the first predetermined voltage level VDD and another terminal to provide the power VVDD2 to the memory cell circuit 203.

Also, the memory cell circuit 203 includes a latch circuit 309, switch devices 311, 313, 315 and 317. The structure of the memory cell circuit 203 shown in FIG. 3 represents a cross-point double-layer pass-gate structure. The latch circuit 309 made up of inverters 323 and 325 has data-storage terminals N1 and N2, and has power receiving terminals P1 and P2 to receive the powers VVDD2 and VVDD1 from the Write-assist circuit 201. The switch device 311 has a bit transferring terminal B1 coupled to the data-storage terminal N1, a control terminal coupled to a first column-based Write word-line 305, and a bit transferring terminal B2. The switch device 313 has a bit transferring terminal B3 coupled to the data-storage terminal N2, a control terminal coupled to a column-based Write word-line 307, and a bit transferring terminal B4 coupled to the bit transferring terminal B2. The switch device 315 has a bit transferring terminal B5 coupled to the bit transferring terminal B4, a control terminal coupled to a row-based Read word-line 319, and a bit transferring terminal BE coupled to a bit-line 321. The switch device 317 has a control terminal coupled to the data-storage terminal N1, a terminal coupled to the bit transferring terminal B5 of the switch device 315, and another terminal coupled to a reference voltage level VVSS.

Besides, the memory cell circuit 203 can further comprise a sensing amplifier, which is coupled to the bit-line, for determining a bit value appearing at the bit-line 321. However, the sensing amplifier is not illustrated in FIG. 3 of the present application.

As described in FIG. 2, the Write-assist circuit 201 provides powers VVDD1 and VVDD2 to the memory cell circuits 203, 205 according to data to be written to the memory cell circuits 203, 205 (i.e. the data transmitted by the Write world-line 305 and the Write world-line 307). Accordingly, if the data 0 is desired to be written to the latch circuit 309, the Write world-line 305 is 0 and the Write world-line 307 is 1, such that the switch device 301 turns off and the switch device 303 turns on. On the contrary, if the data 1 is desired to be written to the latch circuit 309, the Write world-line 305 is 1 and the Write world-line 307 is 0, such that the switch device 301 turns on and the switch device 303 turns off.

Besides the sates of writing data 0 or 1, the memory cell circuits 203, 205 can operates in a Standby mode or a Read mode. The values of the voltage VVDD1 and VVDD2 in different states of the embodiment shown in FIG. 3 are summarized in Table 1.

TABLE 1

|       | Standby | Read | Write "1" | Write "0" |
|-------|---------|------|-----------|-----------|
| VVDD1 | VDD     | VDD  | VDD       | <VDD      |
| VVDD2 | VDD     | VDD  | <VDD      | VDD       |

Besides, the logic values of other lines such as the Read word-line 319, the bit-line 321, the Writing world-lines 305, 307 and the reference voltage level VVSS of the embodiment shown in FIG. 3 are summarized in Table 2.

TABLE 2

|      | Standby | Read | Write "1" | Write "0" |
|------|---------|------|-----------|-----------|
| 321  | 1       | X    | 0         | 0         |
| 319  | 0       | 1    | 1         | 1         |
| 307  | 0       | 0    | 0         | 1         |
| 305  | 0       | 0    | 1         | 0         |
| VVSS | X       | 0    | 1         | 0         |

In view of the values shown in Table 2, it is clear that the Write-assist circuit 201 can provide power VVDD1 and VVDD2 to the memory cell circuits 203, 205 according to data to be written to the memory cell circuits 203, 205.

Figure 4:
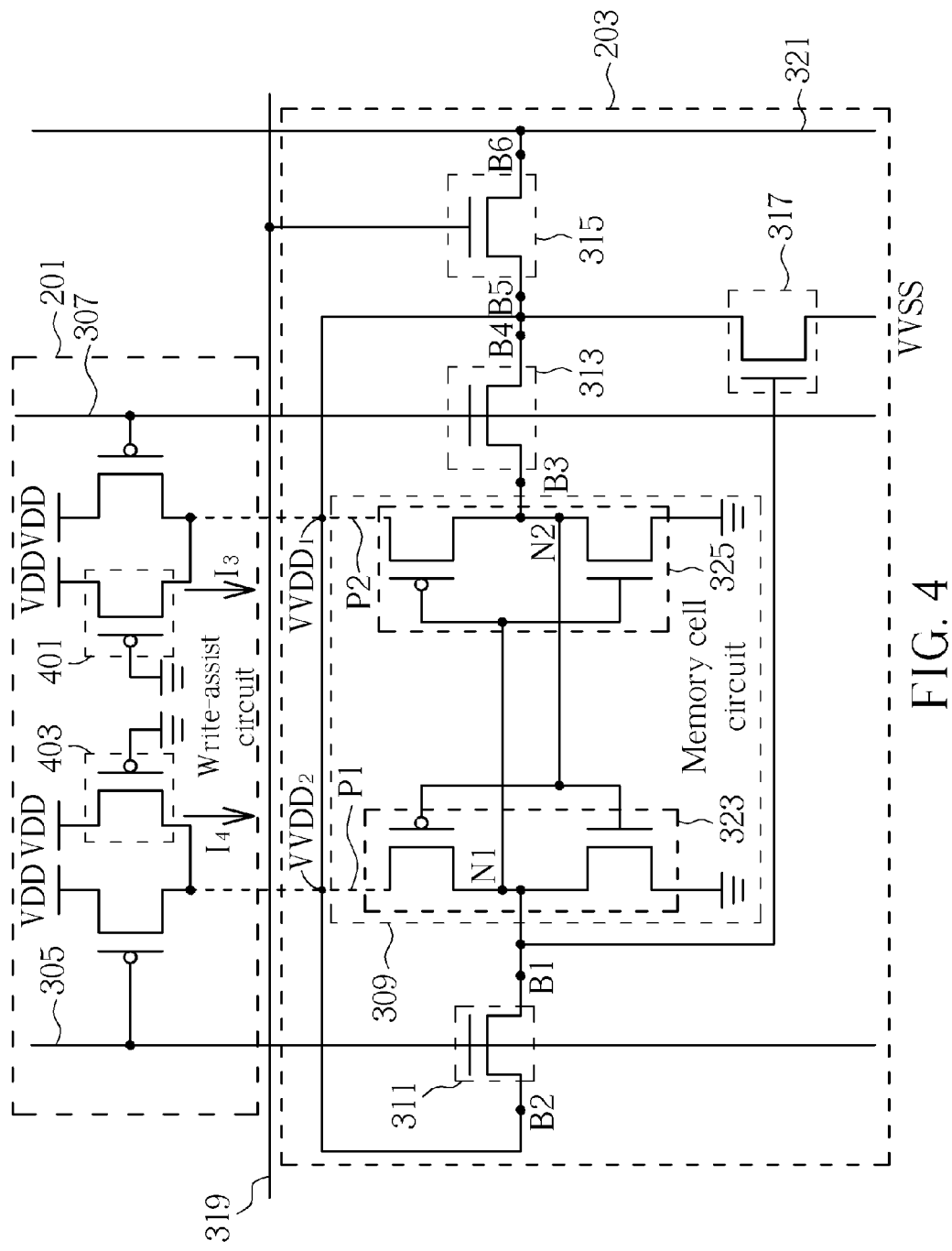
Figure 5:
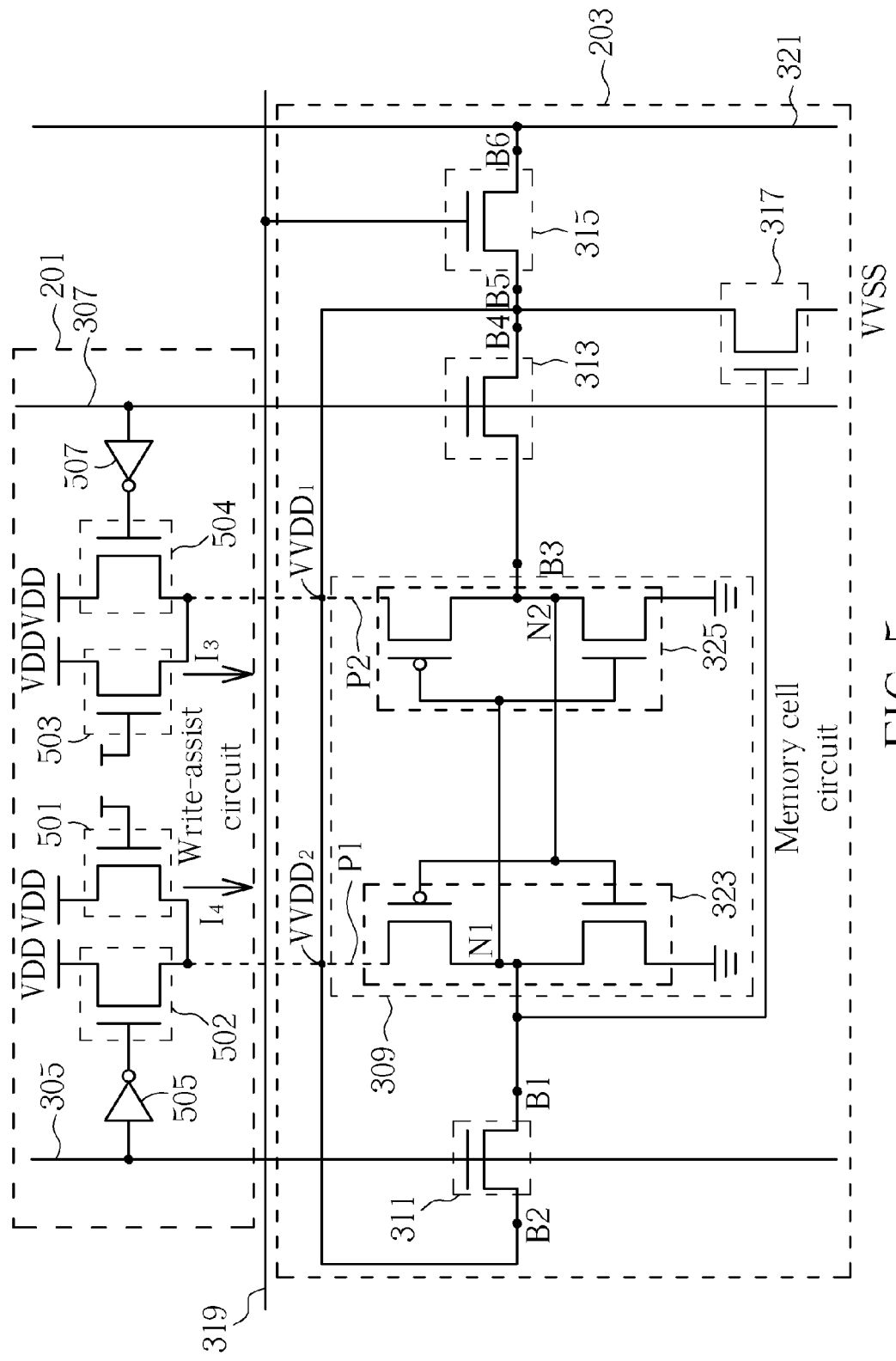

Besides the elements shown in FIG. 3, the Write-assist circuit 201 can further comprise other switch devices utilized as power keepers, such as the switch devices 401 and 403 shown in FIG. 4. The switch devices 401 and 403 can help the switch devices 301, 303 maintain proper level for VVDD1 and VVDD2. The switch devices can be PMOSFETs, as shown in FIG. 4. Alternatively, NMOSFETs can also be utilized as power keepers, such as the NMOSFETs 501 and 503 shown in FIG. 5. Please note that the embodiment shown in FIG. 5 further comprise inverters 505 and 507. The inverter 505 is coupled between the gate terminal of the NMOSFET 502 and the column-based Write word-line 305. Also, the inverter 507 is coupled between the gate terminal of the NMOSFET 504 and the column-based Write word-line 307.

Figure 6:
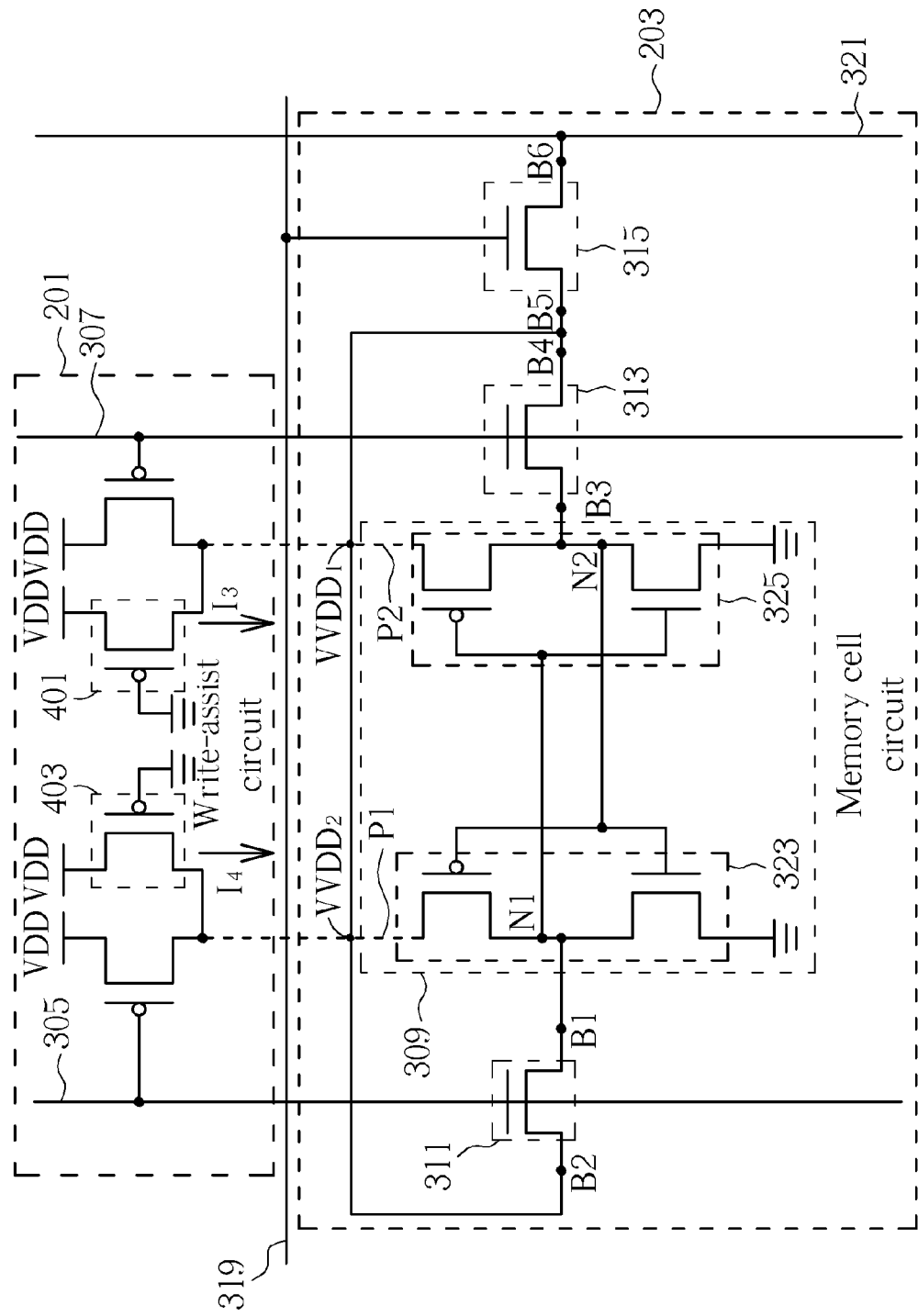

Besides, the memory cell circuit 203 can include other structures besides the structure shown in FIGS. 3 and 4. Comparing the embodiments shown in FIGS. 3, 4 with that in FIG. 6, the switch device 317 is removed in FIG. 6, such that a 7T structure is applied to the memory cell circuits 203 in FIG. 6. The values of the voltage VVDD1 and VVDD2 in different states of the embodiment shown in FIG. 6 is the same as that in Table 1. However, the logic values of other lines such as the row-based word-line 319, the bit-line 321, and the column-based Write world-lines 305, 307 of the embodiment shown in FIG. 6 have some differences with that shown in FIG. 3, and are summarized in Table 3.

TABLE 3

|     | Standby | Read | Write "1" | Write "0" |
|-----|---------|------|-----------|-----------|
| 321 | 1       | X    | 0         | 0         |
| 319 | 0       | 1    | 1         | 1         |
| 307 | 0       | 1    | 0         | 1         |
| 305 | 0       | 0    | 1         | 0         |

Figure 7:
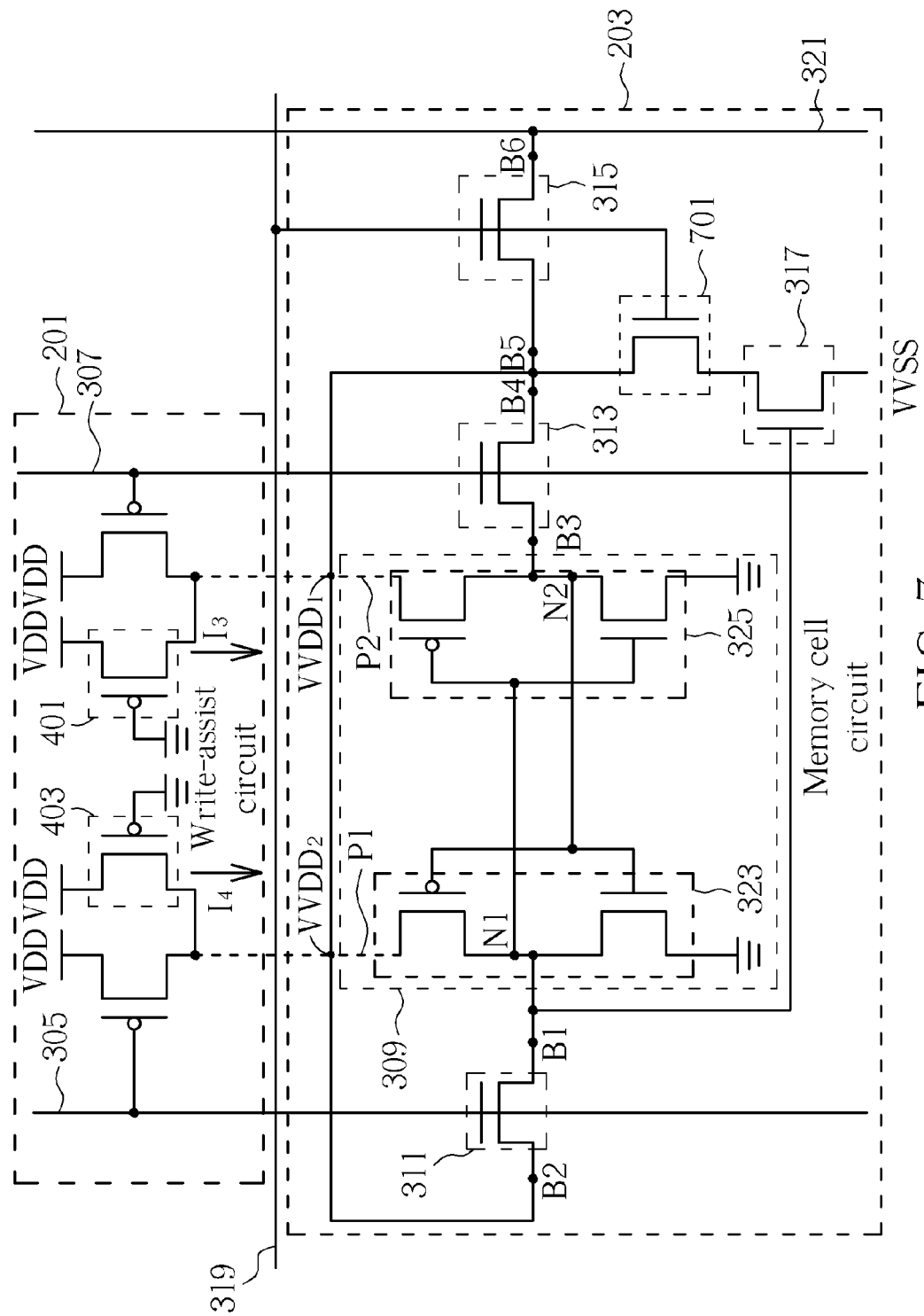

Alternatively, a 9T structure can be applied to the memory cell circuit 203 as well, such as the embodiment shown in FIG. 7. Comparing the embodiments shown in FIGS. 3, 4 with that in FIG. 7, FIG. 7 further includes a switch device 701, such that a 9T structure is applied to the memory cell circuits 203 in FIG. 7.

The values of the voltage VVDD1 and VVDD2 in different states of the embodiment shown in FIG. 7 is the same as that in Table 1. Besides, the logic values of other lines such as the word-line 319, the bit-line 321, the Write word-lines 305, 307, and the reference voltage level VVSS of the embodiment shown in FIG. 7 have the same values as that shown in Table 2.

Figure 8:
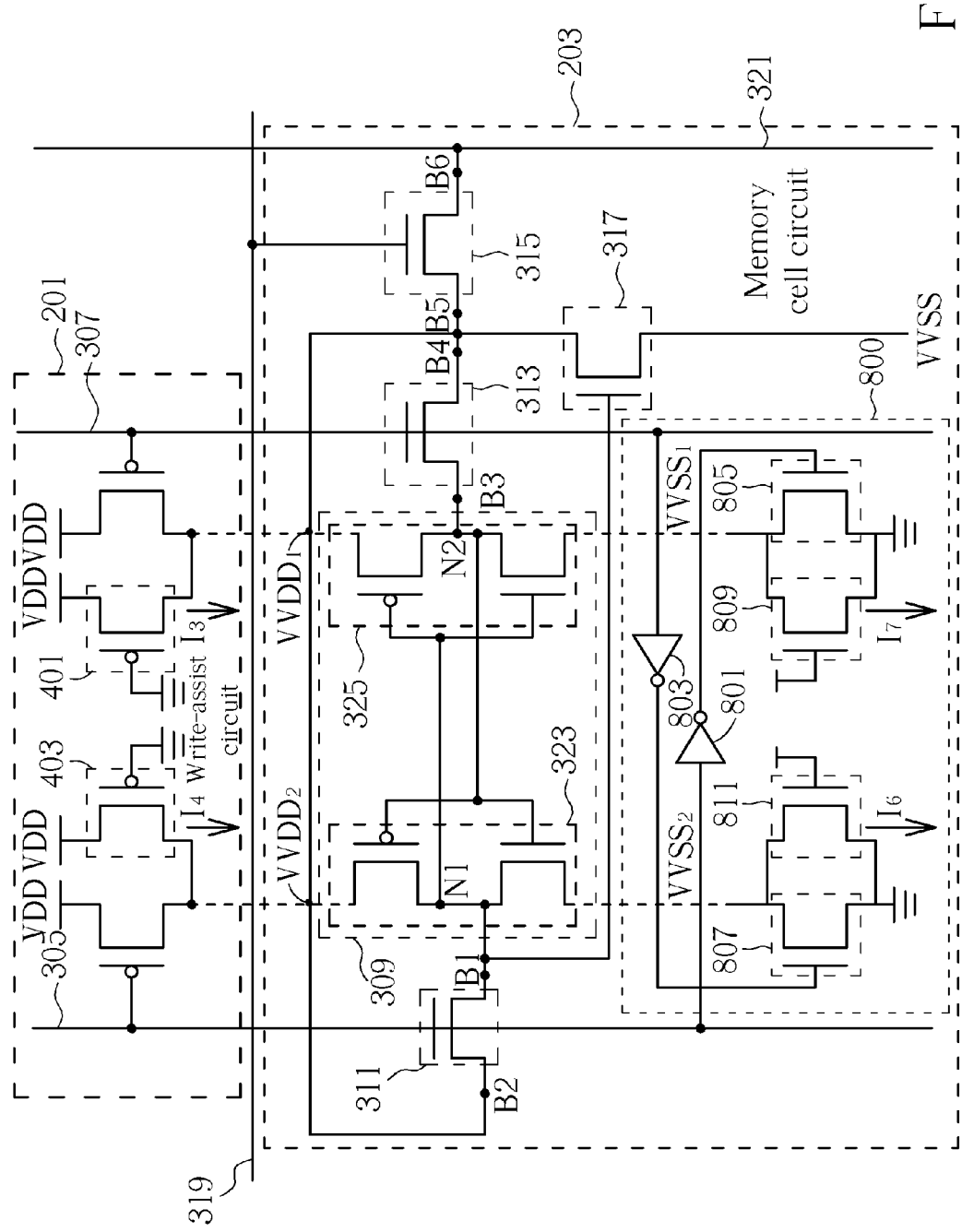

Furthermore, the Write-assist circuit 201 can further include other devices located between the memory cell circuit and a ground voltage level, to help writing data to the latch circuit in the memory cell circuit. As shown in FIG. 8, the Write-assist circuit 800 includes inverters 801, 803, and switch devices 805, 807 (NMOSFET in this embodiment). The switch device 805 has a control terminal coupled to the column-based Write word-line 305 via the inverter 801, another terminal coupled to the memory cell circuit 203, and another terminal coupled to aground level. The switch device 807 has a terminal coupled to the memory cell circuit 203, a control terminal coupled to the column-based Write word-line 307 via the inverter 803, and another terminal coupled to the ground level. The existence of switch devices 805, 807 can improve the efficiency of writing data to the latch circuit 309. Besides the switch devices 805, 807, the Write-assist circuit 800 can further include switch device s 809, 811 as power keepers. The switch device 809 has a terminal coupled to a terminal of the switch device 805, another terminal coupled to the terminal of the switch device 805, and a control terminal coupled to a predetermined voltage level. The switch device 811 has a terminal coupled to the terminal of the switch device 807, a terminal coupled to the terminal of the switch device 807, and a control terminal coupled to the predetermined voltage level. It should be noted that the Write-assist circuit 800 does not necessarily include power keepers, such that the switch devices 809 and 811 can be removed from the Write-assist circuit 800.

The logic values of other lines such as the word-line 319, the bit-line 321, the Write word-lines 305, 307 and the reference voltage level VVSS of the embodiment shown in FIG. 8 are the same as that in Table 2.

The values of the voltages VVDD1, VVDD2, VVSS1 and VVSS2 in different states of the embodiment shown in FIG. 8 are shown in Table 4.

TABLE 4

|       | Standby | Read | Write "1" | Write "0" |
|-------|---------|------|-----------|-----------|
| VVDD1 | VDD     | VDD  | VDD       | <VDD      |
| VVDD2 | VDD     | VDD  | <VDD      | VDD       |
| VVSS1 | VSS     | VSS  | >VSS      | VSS       |
| VVSS2 | VSS     | VSS  | VSS       | >VSS      |

Figure 9:
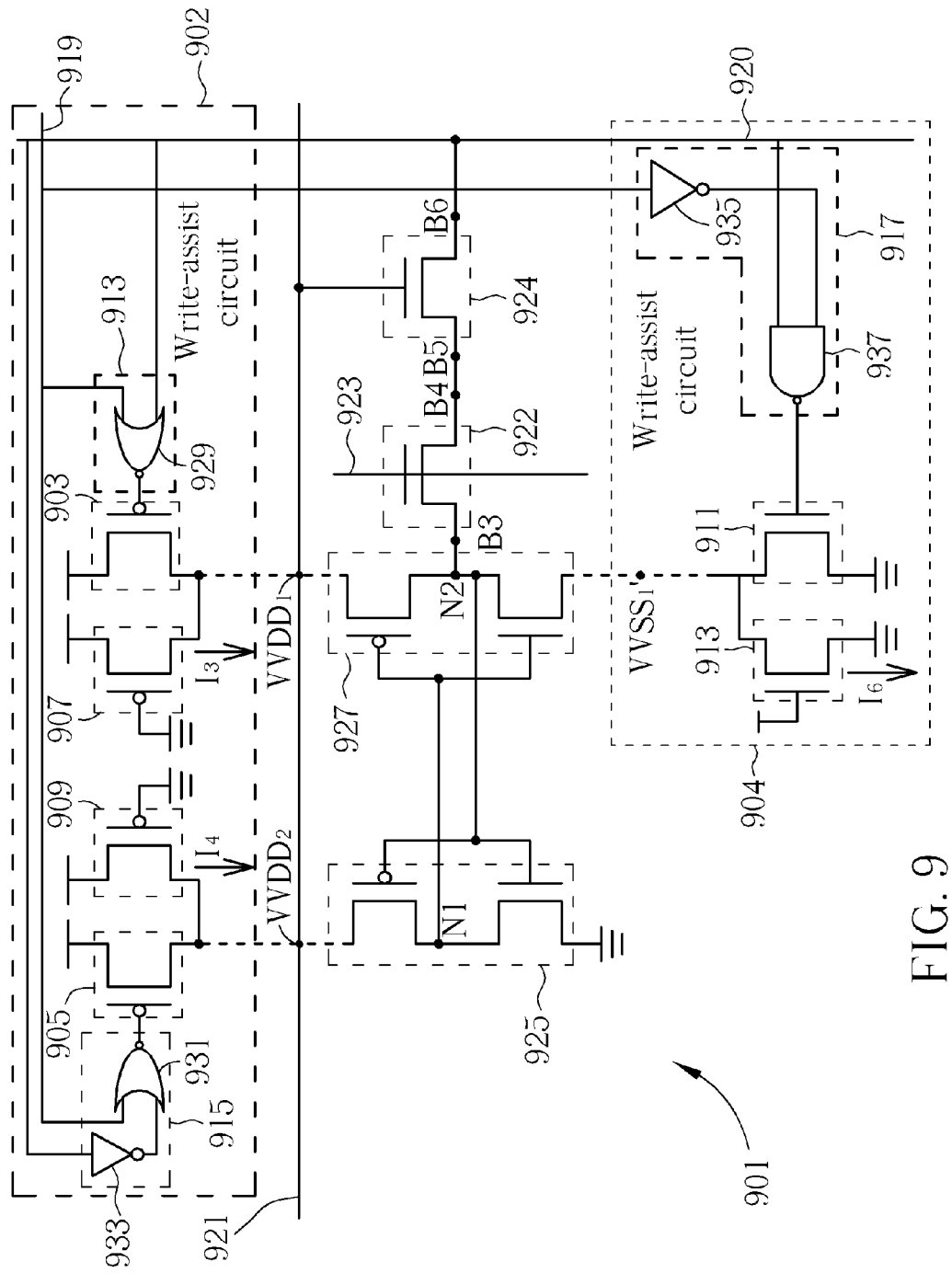
FIGS. 9-11 are circuit diagrams illustrating the single-ended structures of the embodiments shown in FIG. 2.
Figure 10:
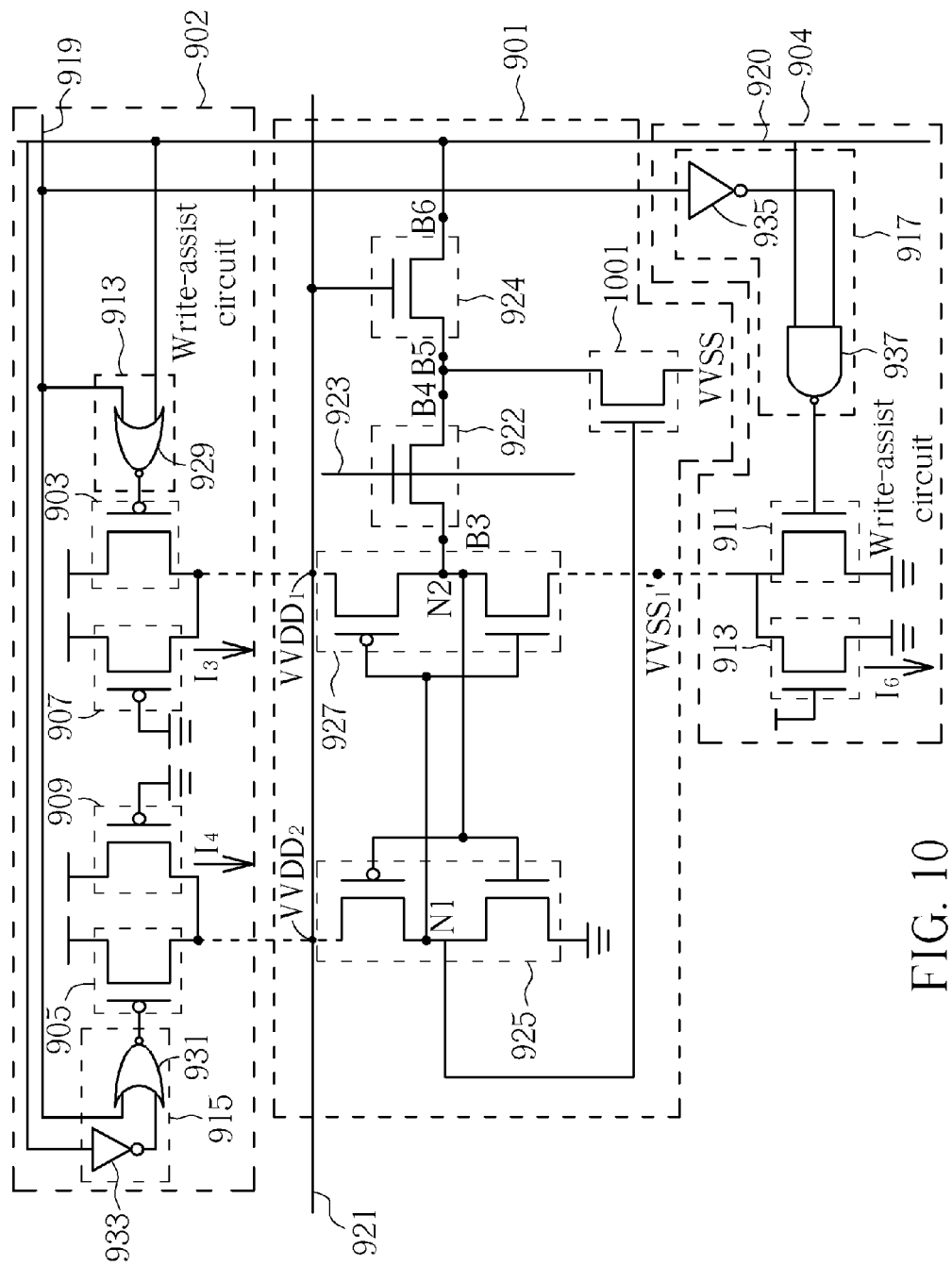
Figure 11:
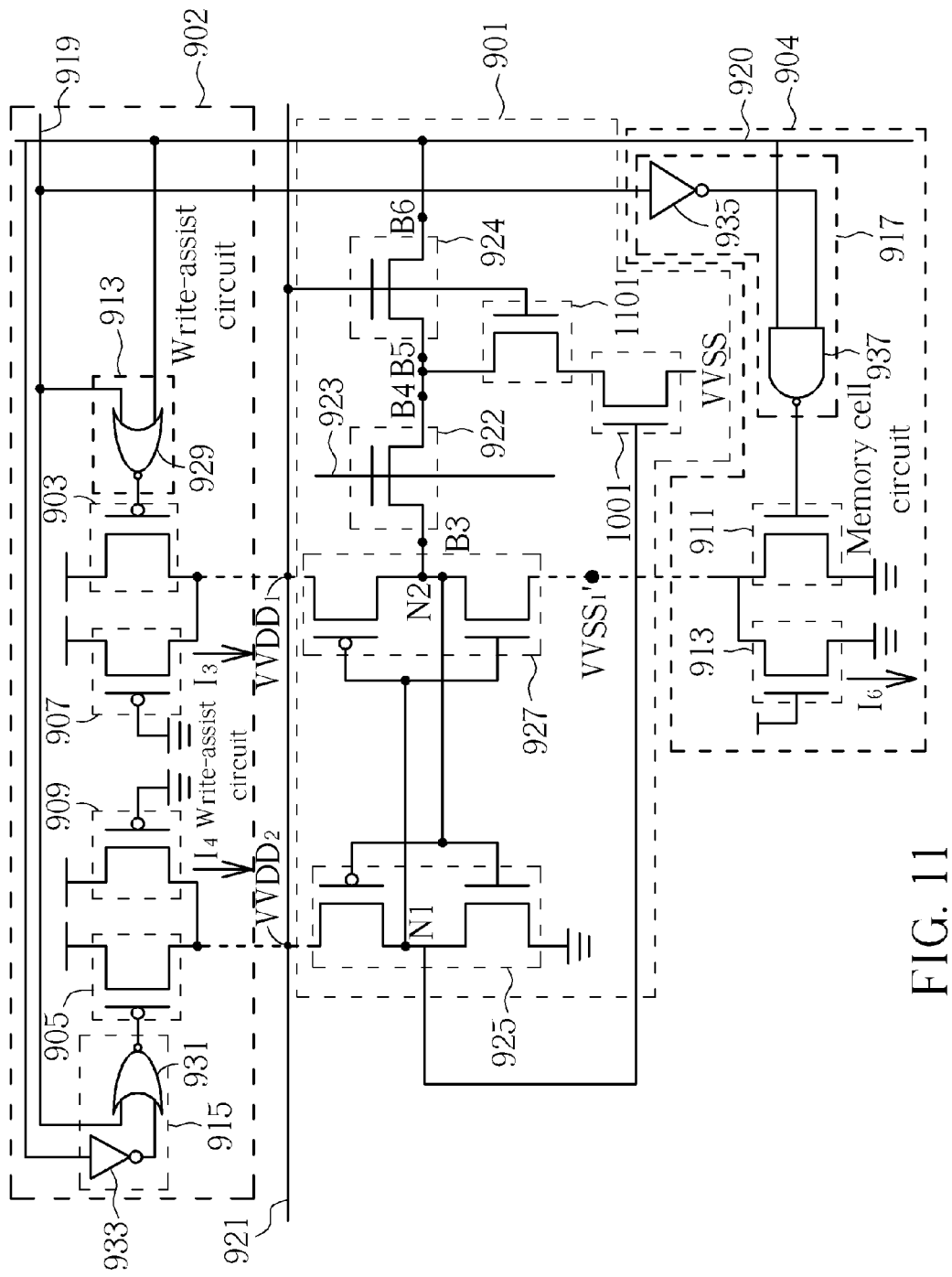

FIGS. 9-11 are circuit diagrams illustrating the single-ended structures of the embodiments shown in FIG. 2. In the embodiment shown in FIG. 9, the memory cell circuit 901 is a 6T structure. Comparing with the memory cell circuits in FIG. 6 with that in FIG. 9, the switch device 311 in FIG. 6 is removed in the embodiment shown in FIG. 9. Besides the switch devices 903~909 (PMOSFET in this embodiment), the switch devices 911~913 (NMOSFET in this embodiment), the Write-assist circuits 902 and 904 can further include logic circuits 913, 915 and 917. In this exemplary embodiment, the switch devices 903~913, (i.e. the power switches) can be controlled by the logic values of a Write-Enable-Bar line 919 and a bit-line 920, via the logic circuits 913, 915 and 917. Thereby the inverters 925 and 927 can be controlled to operate according to the logic values of the Write-Enable-Bar line 919 and the bit-line 920.

In the Standby/Read states, the logic value of the Writing-Enable-Bar line 919 is 1. Also, in the Write state, the logic value of the Write-Enable-Bar line 919 is 0. The switch device 903 turns off while writing data "0". Additionally, the switch device 905 and the switch device 911 turn off while writing data "1". Additionally, the voltage VVDD1 during writing data "0" and the voltages VVDD2/VVSS1 during writing data "1" can be determined by sizes of the switch devices 907, 909 and the switch device 913. Please note that the power keepers switch devices 907, 909 and the switch device 913 can be removed from the embodiment shown in FIG. 9. In this exemplary embodiment, the logic circuit 913 includes a NOR gate 929, the logic circuit 915 includes an inverter 933 and a NOR gate 931, and the logic circuit 917 includes an inverter 935 and a NAND gate 937.

The values of the voltages VVDD1, VVDD2 and VVSS1 in different states of the embodiment shown in FIG. 9 are summarized in Table 5.

TABLE 5

|  | Standby | Read | Write "1" | Write "0" |
| --- | --- | --- | --- | --- |
| VVDD1 | VDD | VDD | VDD | <VDD |
| VVDD2 | VDD | VDD | <VDD | VDD |
| VVSS1 | VSS | VSS | >VSS | VSS |

Besides, the logic values of other lines such as the Write-Enable-Bar line 919, the bit-line 920, the row-based word-line 921, column-based word-line 923 are summarized in Table 6.

TABLE 6

|  | Standby | Read | Write "1" | Write "0" |
| --- | --- | --- | --- | --- |
| 919 | 1 | 1 | 0 | 0 |
| 920 | 1 | X | 1 | 0 |
| 921 | 0 | 1 | 1 | 1 |
| 923 | 0 | 1 | 1 | 1 |

The structure of the memory cell circuit is not limited to that disclosed in the embodiment of FIG. 9. For example, a 7T structure can be applied to the memory cell circuit, as shown in FIG. 10. Comparing the embodiments shown in FIG. 9 and FIG. 10, the embodiment shown in FIG. 10 further comprises a switch device 1001. The values of the voltages VVDD1, VVDD2 and VVSS1 in different states of the embodiment shown in FIG. 10 are the same as that shown in Table 5. Besides, the logic values of other lines such as the Write-Enable-Bar line 919, the bit-line 920, the row-based word-line 921, column-based word-line 923, and the reference voltage level VVSS of the embodiment shown in FIG. 10 are summarized in Table 7.

TABLE 7

|  | Standby | Read | Write "1" | Write "0" |
| --- | --- | --- | --- | --- |
| 919 | 1 | 1 | 0 | 0 |
| 920 | 1 | X | 1 | 0 |
| 921 | 0 | 1 | 1 | 1 |
| 923 | 0 | 0 | 1 | 1 |
| VVSS | X | 0 | X | X |

Besides, an 8T structure can be applied to the memory cell circuit, as shown in FIG. 11. Comparing the embodiments shown in FIG. 10 and FIG. 11, the embodiment shown in FIG. 11 further comprise a switch device 1101. The values of the voltages VVDD1, VVDD2 and VVSS1 in different states of the embodiment shown in FIG. 11 are the same as that shown in Table 5. Additionally, the logic values of other lines such as the Write-Enable-Bar line 919, the bit-line 920, the row-based word-line 921, the column-based word-line 923, and the reference voltage level VVSS of the embodiment shown in FIG. 11 are the same as that shown in Table 7.

In view of aforementioned embodiments, the Write-assist circuit is data-aware and can dynamically adjust power supply (i.e. VVDD1 and VVDD2) for left-half and right-half cell (i.e. the two inverters in the latch circuit of the memory cell circuit) according to the input data. Dynamically lowering half-cell power supply based on input data reduces the contention of holding PMOS to facilitate discharging of the cell storage node, while the opposite half-cell inverter remains unaffected to maintain its latching strength and feedback mechanism, thus improving Write-ability, Write Margin, and Write performance. Data-aware switching of half-cell supplies also reduces dynamic supply switching power and noise to half, and improves supply switching speed. Hence, fast, low-power, low-noise dynamic supply switching can be performed, and the Write-ability and Time-to-Write can be improved. Besides, the timing of power supply switching (i.e. turning on/off of the Write-assist circuit) is initiated directly from the input data, thus tolerant to PVT variation and $V_T$ scatter. The embodiments require only 2 power-switch PMOSFETs and 2 power keepers per column (bit-line pair) and do not introduce any extra loading to bit-line, hence high-performance, low-voltage, low-power operation with minimum overhead of device count and area can be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static random access memory with data controlled power supply, comprising:
    a memory cell circuit; and
    at least one Write-assist circuit, for providing power to the memory cell circuit according to data to be written to the memory cell circuit, comprising:
        a first switch device, having a first terminal coupled to a first column-based Write word-line, a second terminal coupled to a first predetermined voltage level and a third terminal to provide the power to the memory cell circuit; and
        a second switch device, having a first terminal coupled to a second column-based Write word-line, a second terminal coupled to the first predetermined voltage level and a third terminal to provide the power to the memory cell circuit.

2. The static random access memory of claim 1, wherein the memory cell circuit includes a plurality of data accessing terminals and the data accessing terminals respectively controlled by at least two switch devices.

3. The static random access memory of claim 1, wherein the Write-assist circuit comprises:
    a power keeper, for providing currents to the memory cell circuit when the first switch device and the second switch device turn off.

4. The static random access memory of claim 3, wherein the power keeper comprises:
    a third switch device, having a first terminal coupled to a ground level, a second terminal coupled to the third terminal of the first switch device, and a third terminal coupled to the first predetermined voltage level; and
a fourth switch device, having a first terminal coupled to a ground level, a second terminal coupled to the third terminal of the second switch device and a third terminal coupled to the first predetermined voltage level.

5. The static random access memory of claim 1, wherein the Write-assist circuit comprises:
a first inverter;
a second inverter;
a third switch device, having a first terminal coupled to the memory cell circuit, a second terminal coupled to the first column-based Write word-line via the first inverter, and a third terminal coupled to a ground level; and
a fourth switch device, having a first terminal coupled to the memory cell circuit, a second terminal coupled to the second column-based Write word-line via the second inverter, and a third terminal coupled to the ground level.

6. The static random access memory of claim 5, wherein the Write-assist circuit comprises:
a fifth switch device, having a first terminal coupled to the first terminal of the first switch device, a second terminal coupled to the third terminal of the third switch device, and a third terminal coupled to the first predetermined voltage level; and
a sixth switch device, having a first terminal coupled to the first terminal of the second switch device, a second terminal coupled to the third terminal of the fourth switch device, and a third terminal coupled to the first predetermined voltage level.

7. The static random access memory of claim 1, wherein the memory cell circuit comprises:
a latch circuit, having a first data-storage terminal and a second data-storage terminal, and having power receiving terminals to receive the power from the Write-assist circuit;
a third switch device, having a first bit transferring terminal coupled to the first data-storage terminal, a first control terminal coupled to the first column-based Write word-line, and a second bit transferring terminal;
a fourth switch device, having a third bit transferring terminal coupled to the second data-storage terminal, a second control terminal coupled to the second column-based Write word-line, and a fourth bit transferring terminal coupled to the second bit transferring terminal;
a fifth switch device, having a fifth bit transferring terminal coupled to the fourth bit transferring terminal, a third control terminal coupled to a row-based word-line, and a sixth bit transferring terminal coupled to a bit-line; and
a sensing amplifier, coupled to the bit-line, for determining a bit value appearing at the bit-line.

8. The static random access memory of claim 7, wherein the memory cell circuit further comprises:
a sixth switch device, having a control terminal coupled to the first data-storage terminal, a first terminal coupled to the fifth bit transferring terminal of the fifth switch device, and a second terminal coupled to a reference voltage level.

9. The static random access memory of claim 8, wherein the memory cell circuit further comprises:
a seventh switch device, having a first terminal coupled to the fifth bit transferring terminal of the fifth switch device, a second terminal coupled to the first terminal of the sixth switch device, and a control terminal coupled to the row-based word-line.

10. A static random access memory with data controlled power supply, comprising:
a memory cell circuit;
at least one Write-assist circuit, for providing power to the memory cell circuit according to data to be written to the memory cell circuit;
a first switch device, having a first terminal coupled to the memory cell circuit, a second terminal coupled to the first column-based Write word-line via a first inverter coupled between the second terminal of the first switch device and the first column-based Write word-line, and a third terminal coupled to the first predetermined voltage level;
a second switch device, having a first terminal coupled to the memory cell circuit, a second terminal coupled to the second column-based Write word-line via a second inverter coupled between the second terminal of the second switch device and the second column-based Write word-line, and a third terminal coupled to the first predetermined voltage level;
a third switch device, having a first terminal coupled to the first predetermined voltage level, a second terminal coupled to the third terminal of the first switch device, and a third terminal coupled to the first terminal of the first switch device; and
a fourth switch device, having a first terminal coupled to the first switch device, a second terminal coupled to the third terminal of the second switch device, and a third terminal coupled to the first terminal of the second switch device.

11. A static random access memory with data controlled power supply, comprising:
a memory cell circuit; and
at least one Write-assist circuit, for providing power to the memory cell circuit according to data to be written to the memory cell circuit, comprising:
a Write-Enable-Bar line;
a first logic circuit, coupled to the Write-Enable-Bar line and a bit-line to generate a first control signal;
a second logic unit, coupled to the Write-Enable-Bar line and the bit-line to generate a second control signal;
a first switch device, having a first terminal receiving the first control signal, a second terminal coupled to the first predetermined voltage level and a third terminal to provide the power to the memory cell circuit; and
a second switch device, having a first terminal receiving the second control signal, a second terminal coupled to the first predetermined voltage level and a third terminal to provide the power to the memory cell circuit.

12. The static random access memory of claim 11, wherein the Write-assist circuit comprises:
a power keeper, for providing currents to the memory cell circuit when the first switch device and the second switch device turn off.

13. The static random access memory of claim 12, further comprising:
a third switch device, having a first terminal coupled to a ground level, a second terminal coupled to the third terminal of the first switch device and a third terminal coupled to the first predetermined voltage level; and
a fourth switch device, having a first terminal coupled to a ground level, a second terminal coupled to the third terminal of the second switch device and a third terminal coupled to the first predetermined voltage level.

14. The static random access memory of claim 11, wherein the Write-assist circuit comprises:
a third logic circuit, coupled to the Write-Enable-Bar line and the bit-line to generate a third control signal; and a third switch device, having a first terminal receiving the third control signal, a second terminal coupled to a ground voltage level and a third terminal coupled to the memory cell circuit.

15. The static random access memory of claim 14, wherein the Write-assist circuit comprises:
   a power keeper, for providing currents to the memory cell circuit when the first switch device turns off.

16. The static random access memory of claim 15, wherein the power keeper comprises:
   a fourth switch device, having a first terminal coupled to the first predetermined voltage level, a second terminal coupled to the ground voltage level, and a third terminal coupled to the third terminal of the third switch device.

17. The static random access memory of claim 11, wherein the memory cell circuit comprises:
   a latch circuit, having a first data-storage terminal and a second data-storage terminal, and having power receiving terminals to receive the power from the Write-assist circuit;
   a third switch device, having a first bit transferring terminal coupled to the first data-storage terminal, a first control terminal coupled to a first column-based word-line, and a second bit transferring terminal; and
   a fourth switch device, having a third bit transferring terminal coupled to the second bit transferring terminal, a second control terminal coupled to a second row-based word-line, and a fourth bit transferring terminal coupled to a bit-line.

18. The static random access memory of claim 17, wherein the memory cell circuit further comprises:
   a fifth switch device, having a control terminal coupled to the second data-storage terminal, a first terminal coupled to the third bit transferring terminal of the fourth switch device, and a second terminal coupled to a reference voltage level.

19. The static random access memory of claim 17, wherein the memory cell circuit further comprises:
   a sixth switch device, having a control terminal coupled to the second row-based word-line, a first terminal coupled to the third bit transferring terminal of the second switch device, and a second terminal coupled to the first terminal of the fifth switch device.

* * * * *